United States Patent
Hokayem et al.

(10) Patent No.: US 10,680,694 B1
(45) Date of Patent: Jun. 9, 2020

(54) CROSS-MIXING BEAMFORMER

(71) Applicants: Rimon Hokayem, Miami, FL (US); Elias Alwan, Miami, FL (US); John L. Volakis, Miami, FL (US)

(72) Inventors: Rimon Hokayem, Miami, FL (US); Elias Alwan, Miami, FL (US); John L. Volakis, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 16/775,571

(22) Filed: Jan. 29, 2020

(51) Int. Cl.
*H01Q 21/00* (2006.01)
*H04B 7/06* (2006.01)
*H03D 7/16* (2006.01)
*H04L 27/152* (2006.01)

(52) U.S. Cl.
CPC ........... *H04B 7/0617* (2013.01); *H01Q 21/00* (2013.01); *H03D 7/163* (2013.01); *H04L 27/152* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,315,728 B2 * | 1/2008 | Mimura | ............ | G01R 29/0892 343/756 |
| 10,243,412 B1 * | 3/2019 | Fink | ........................ | H02J 50/40 |
| 10,439,851 B2 * | 10/2019 | Novak | ..................... | H04L 27/14 |
| 2004/0203545 A1 * | 10/2004 | Ohtaki | .................... | H04B 7/084 455/130 |
| 2014/0192923 A1 * | 7/2014 | Matsuo | .................... | H01Q 3/28 375/296 |
| 2016/0359533 A1 * | 12/2016 | Obara | .................. | H04B 7/0408 |
| 2018/0083813 A1 * | 3/2018 | Novak | ..................... | H01Q 3/42 |
| 2020/0091608 A1 * | 3/2020 | Alpman | ............... | H01Q 9/0414 |

OTHER PUBLICATIONS

Wang et al., Self-Mixing Antenna Arrays with Wide Receiving Angular Range, IEEE International Symposium on Antennas and Propagation & USNC/URSI National Radio Science Meeting, Vancouver, BC, 2015, pp. 647-648.

Kornprobst et al., A Millimeter-Wave Self-Mixing Array with Large Gain and Wide Angular Receiving Range, IEEE Transactions on Antennas and Propagation, vol. 66, No. 2, Feb. 2018, pp. 702-711.

* cited by examiner

*Primary Examiner* — Cindy Trandai
(74) *Attorney, Agent, or Firm* — Saliwanchik, Lloyd & Eisenschenk

(57) ABSTRACT

Systems and methods for beamforming using a cross-mixing architecture are provided. A beamformer can use an element-to-element mixing concept and can avoid the use of conventional bulky analog phase shifters. Incident signals can be sent through a phase-locked loop and then mixed with a signal from an antenna element oppositely spaced about a phase center of the antenna element array. Beamformers can be integrated into existing hybrid structures by substituting the traditional analog part of the beamforming process.

20 Claims, 12 Drawing Sheets

CROSS-MIXING BEAMFORMER

BACKGROUND

Future 5G communications links are expected to support data rates 50 times faster than current 4G LTE networks. The enabling infrastructure includes radio frequency (RF) front-ends that can handle this data increase using transceivers that are wideband, but also very small in size and weight and low in power (low SWaP). As such, there is a growing interest in reducing the size of ultra-wideband (UWB) apertures and RF electronics to enable compact integration on small platforms. However, the current spectrum suffers from congestion and limitations on available bandwidth, so there is a need for advanced techniques to enhance the efficient access to this spectrum, such as full duplex systems or higher order modulation and coding schemes. Such techniques are often associated with hardware and computational complexities. The latter might be avoided by exploring the yet unused millimeter-wave (mm-wave) spectrum, which offers more bandwidth and much higher data rates.

Concurrently, the small size of RF devices and antenna apertures at mm-waves provides an impetus for realizing low profile and portable systems. Nevertheless, mm-wave technologies suffer from high path-loss and atmospheric absorption that drastically reduce the communication range. To compensate for the path loss, high gain beamforming antenna array systems are required, but traditional analog and digital beamformers are narrowband, power-hungry, and SWaP-inefficient.

BRIEF SUMMARY

Embodiments of the subject invention provide novel and advantageous systems and methods for beamforming using a cross-mixing concept and/or architecture. A beamformer can use an element-to-element mixing concept and can avoid the use of conventional bulky analog phase shifters. Beamformers of embodiments of the subject invention can be integrated into existing hybrid structures by substituting the traditional analog part of the beamforming process for more compact and size-, weight-, and power-(SWaP)-efficient systems. While traditional analog and digital beamformers are power-hungry and SWaP-inefficient, hybrid beamforming systems and methods of embodiments of the subject invention are SWaP-efficient because they avoid many or all of the bulky and power-hungry analog elements. Systems and methods of embodiments of the subject invention can be used for ultra-wideband (UWB) hybrid beamforming apertures, for example as the radio frequency (RF) front-end of such applications.

In an embodiment, a cross-mixing beamformer (CMB) antenna device can comprise: a first plurality of antenna elements; and a first CMB in operable communication with the first plurality of antenna elements. The first CMB can be configured to respectively mix signals from oppositely spaced antenna elements of the first plurality of antenna elements to generate a first plurality of mixed signals that are summed to generate a first combined signal, such that a first local oscillator (LO) signal from a first antenna element is mixed with a first RF signal from a second antenna element oppositely spaced, about a phase center of the first plurality of antenna elements, from the first antenna element to generate a first mixed signal of the first plurality of mixed signals and such that a second LO signal from the second antenna element is mixed with a second RF signal from the first antenna element to generate a second mixed signal of the first plurality of mixed signals. The first CMB can be further configured to put incident signals received by the respective antenna elements of the first plurality of antenna elements through respective phase-locked loops (PLLs) prior to mixing, such that a first incident signal received by the first antenna element is put through a first PLL to generate the first LO signal, and a second incident signal received by the second antenna element is put through a second PLL to generate the second LO signal. The first plurality of antenna elements can comprise a first middle antenna element at the phase center of the first plurality of antenna elements, and the first CMB can be further configured to split a first middle incident signal into a first part and a second part, put the first part of the first middle incident signal through a first middle PLL to generate a first middle PLL signal, mix the first middle PLL signal with the first combined signal to generate a first corrected signal, and combine the second part of the first middle incident signal with the first corrected signal to generate a first output signal of the first CMB. The first plurality of antenna elements can comprise a first subarray of antenna elements, and the device can further comprise a first analog-to-digital converter (ADC) in operable communication with the first CMB and configured to receive a first output signal from the first CMB. This pattern can be repeated such that each subarray feeds to a CMB, which provides an output signal to an ADC (see, e.g., FIG. 1).

In another embodiment, a method of cross-mixing beamforming can comprise: receiving (e.g., by a first plurality of antenna elements) a first plurality of incident signals (respectively); and respectively mixing, by a first CMB (e.g., in operable communication with the first plurality of antenna elements), signals from oppositely spaced antenna elements (e.g., of the first plurality of antenna elements) to generate a first plurality of mixed signals that are summed to generate a first combined signal, such that a first LO signal from a first antenna element is mixed with a first RF signal from a second antenna element oppositely spaced, about a phase center (e.g., of the first plurality of antenna elements), from the first antenna element to generate a first mixed signal of the first plurality of mixed signals and such that a second LO signal from the second antenna element is mixed with a second RF signal from the first antenna element to generate a second mixed signal of the first plurality of mixed signals.

DETAILED DESCRIPTION

Embodiments of the subject invention provide novel and advantageous systems and methods for beamforming using a cross-mixing concept and/or architecture. A beamformer can use an element-to-element mixing concept and can avoid the use of conventional bulky analog phase shifters. Beamformers of embodiments of the subject invention can be integrated into existing hybrid structures by substituting the traditional analog part of the beamforming process for more compact and size-, weight-, and power-(SWaP)-efficient systems. While traditional analog and digital beamformers are power-hungry and SWaP-inefficient, hybrid beamforming systems and methods of embodiments of the subject invention are SWaP-efficient because they avoid many of the bulky and power-hungry analog elements. Systems and methods of embodiments of the subject invention can be used for ultra-wideband (UWB) hybrid beamforming apertures, for example as the radio frequency (RF) front-end of such applications.

Figures 2A, 2B:
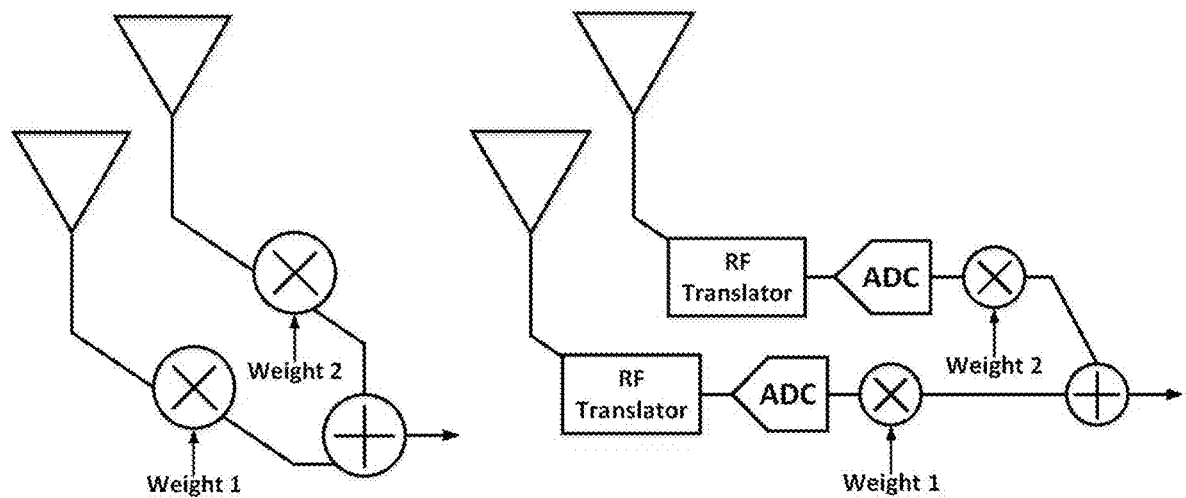
FIG. 2A is a schematic diagram of an analog beamforming architecture.
FIG. 2B is a schematic diagram of a digital beamforming architecture.
Figure 2C:
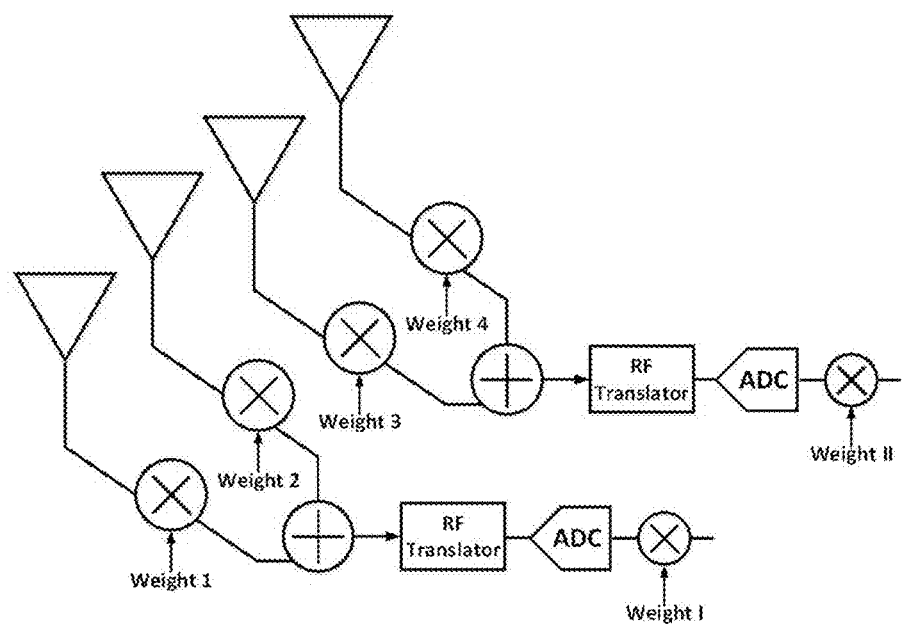
FIG. 2C is a schematic diagram of a hybrid beamforming architecture.

FIG. 2A is a schematic diagram of an analog beamforming architecture; FIG. 2B is a schematic diagram of a digital beamforming architecture; and FIG. 2C is a schematic diagram of a hybrid beamforming architecture. Referring to FIGS. 2A and 2B, beamforming can be implemented at the analog RF front-end (FIG. 2A) or at the digital baseband back-end (FIG. 2B). Analog beamforming employs inexpensive phase shifters, which are bulky, frequency dependent, and restricted to one given angle of arrival (AoA). By contrast, digital beamforming provides more flexibility by utilizing adaptive algorithms for signal tracking, reception enhancement, and interference mitigation. Though, digital techniques suffer from complexity, high cost, and massive size, especially when integrated with systems operating at millimeter (mm)-wave frequencies. In an effort to optimize size, cost, and operation, hybrid beamforming presents an optimal solution by combining both analog and digital techniques (see FIG. 2C). Notably, the hybrid process benefits from the reduction in the number of analog-to-digital converters (ADCs), downsizes the system, and maintains flexibility and adaptive behavior. Nevertheless, hybrid beamformers can be bulky due to the large number of ADCs and phase shifters, but the SWaP-efficient beamforming structures of embodiments of the subject invention address this problem.

Figure 1:
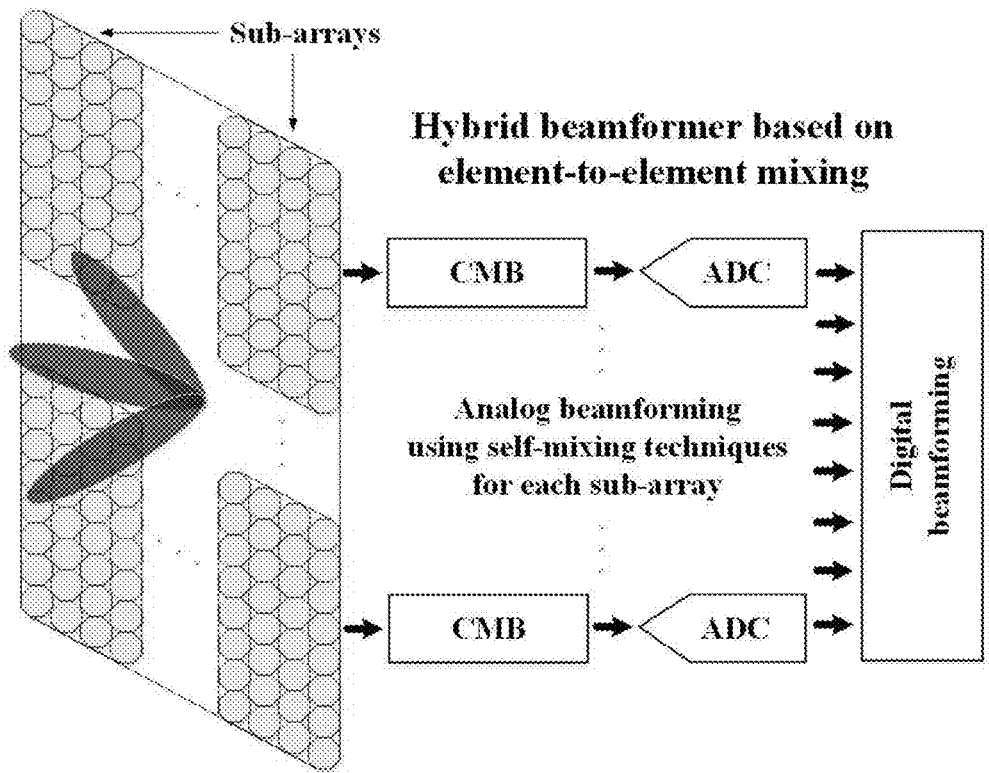
FIG. 1 is a schematic view of a beamforming topology with self-mixing for phase delay cancellation, according to an embodiment of the subject invention.

FIG. 1 is a schematic view of a beamforming topology with self-mixing for phase delay cancellation, according to an embodiment of the subject invention. Referring to FIG. 1, the cross-mixing beamformer (CMB) architecture stems from the self-mixing concept and provides avenues for a new class of beamforming structures. The CMB can be used as an RF front-end with frequency independent and autonomous beamforming topology, which can be used with, for example, 5G and mm-wave technologies.

Figure 4:
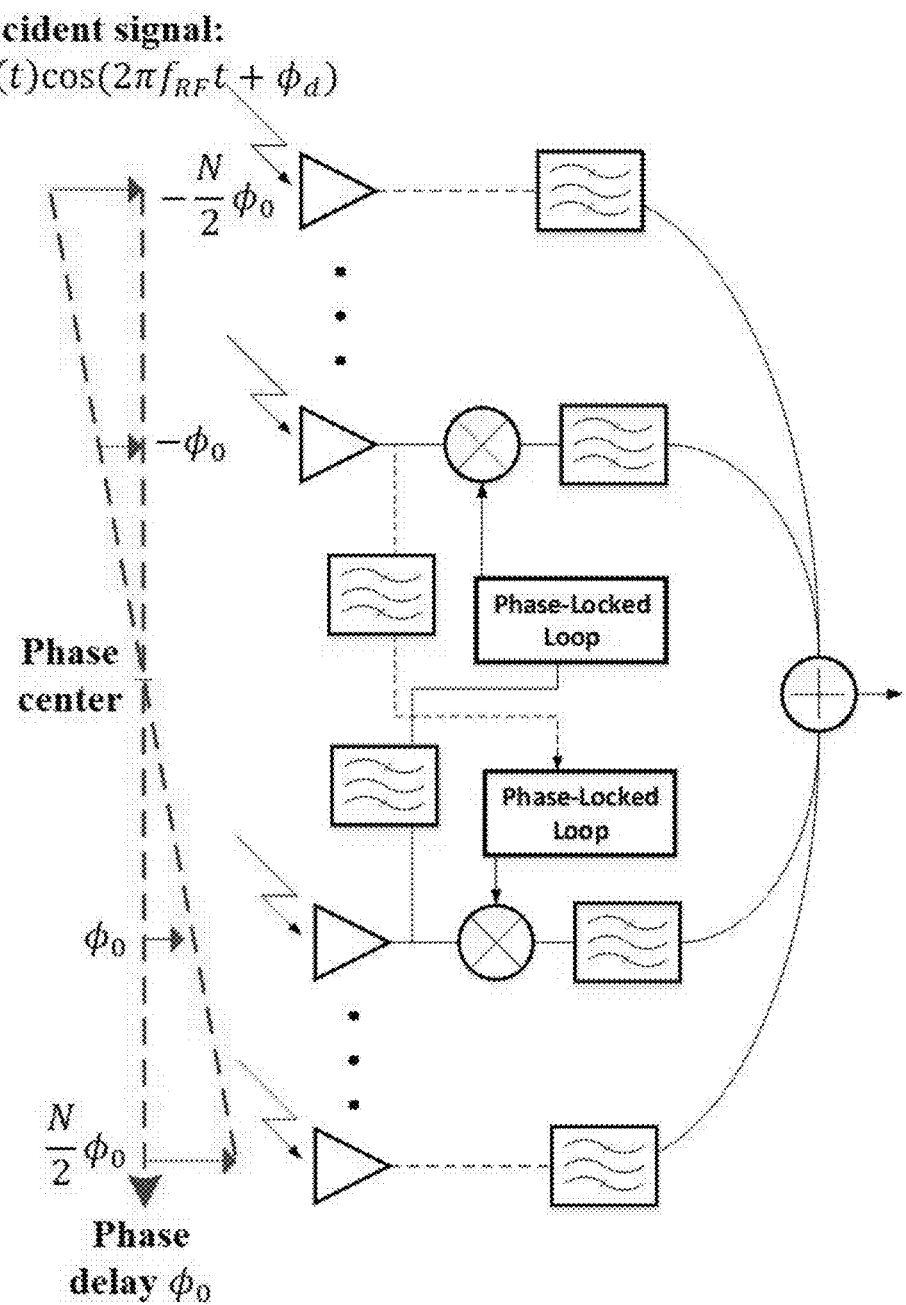
FIG. 4 is a schematic diagram depicting beamforming based on an element-to-element mixing architecture, according to an embodiment of the subject invention.
Figure 16:
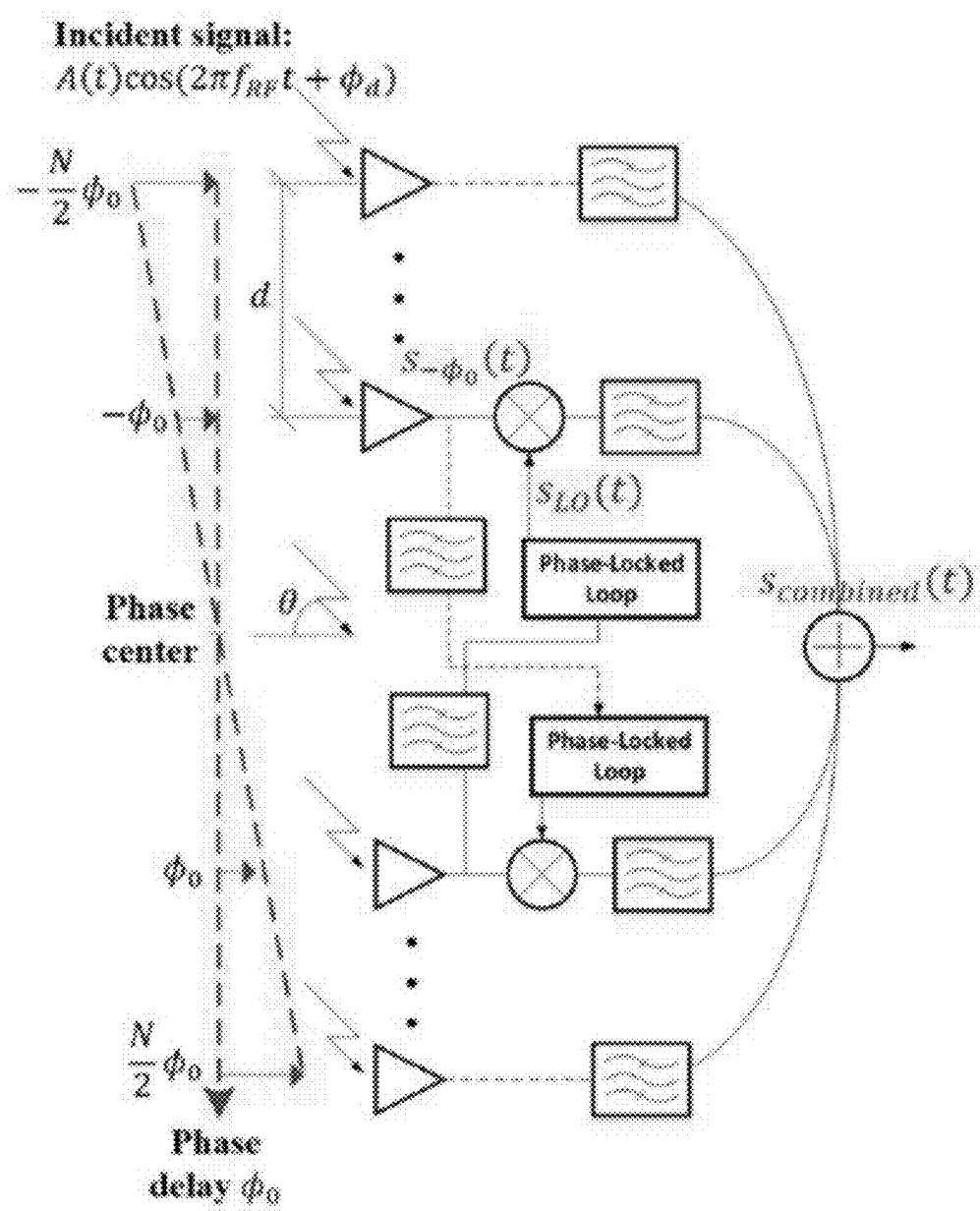
FIG. 16 is a schematic diagram depicting beamforming based on an element-to-element mixing architecture, according to an embodiment of the subject invention.

FIG. 4 is a schematic diagram depicting beamforming based on an element-to-element mixing architecture, according to an embodiment of the subject invention, and FIG. 16 shows a similar schematic diagram with some additional notation. Referring to FIGS. 4 and 16, the architecture of embodiments of the subject invention can address the problems of mm-wave beamforming architectures, such as size and high power consumption of RF components, and phase instability. Such issues can be mitigated, minimized, and/or avoided by implementing the self-mixing concept central to the architecture of embodiments of the subject invention.

Self-mixing can be done by the carrier signal that is transmitted along with the information or by the LO signal that is self-generated by the information signal itself. The need for LO sources, and the ensuing synchronization problem, can therefore be avoided. The architecture is based on generating the LO signal from the received signals. Then, by mixing the array elements together, the phase delays can be canceled out in a frequency independent manner and for any AoA. That is, the beamformer is based on element-to-element mixing to achieve maximum diversity gain and enhance the receiver's sensitivity, satisfying the performance requirements of beamforming techniques. More importantly, the design/architecture establishes a degree of flexibility in the analog domain. In addition, the CMB topology removes bulky phase shifters and converts the signal with self-generation of LO sources, resulting in substantial reduction in size, weight, power, and cost (SWAP-c) as compared to other beamformers.

Figure 3A:
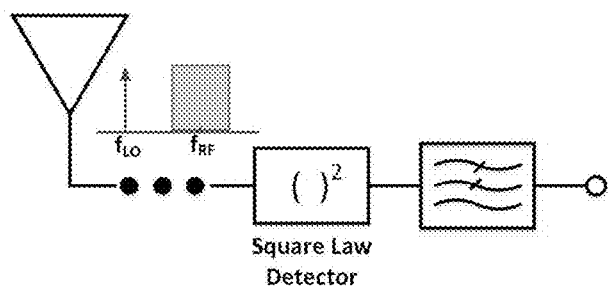
FIG. 3A is a schematic diagram of self-mixing for direct square law detection.
Figures 3B, 3C:
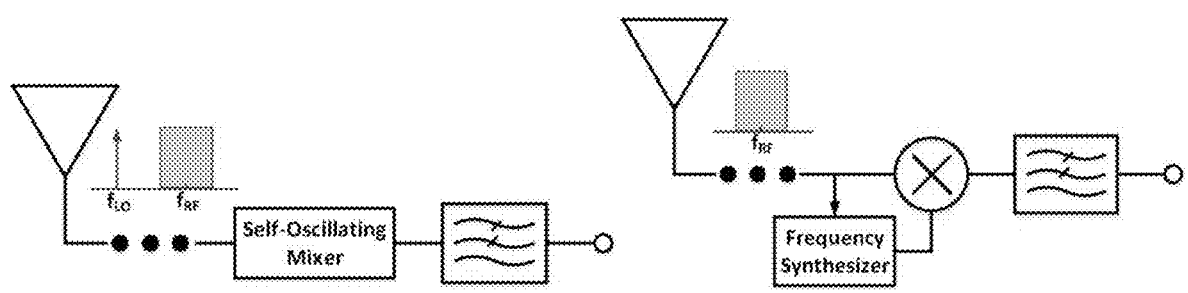
FIG. 3B is a schematic diagram of self-mixing for direct self-oscillating mixing.
FIG. 3C is a schematic diagram of self-mixing for indirect local oscillator (LO) signal self-generation.

FIG. 3A is a schematic diagram of self-mixing for direct square law detection; FIG. 3B is a schematic diagram of self-mixing for direct self-oscillating mixing; and FIG. 3C is a schematic diagram of self-mixing for indirect LO signal self-generation. Referring to FIGS. 3A-3C, self-mixing can be implemented using either direct, self-heterodyne (FIGS. 3A and 3B) or indirect mixing, self-homodyne (FIG. 3C). In direct self-mixing, square-law devices are employed using a diode for direct detection and down-conversion. Alternatively, transistors can be used to reduce high conversion loss, and while such a technique is very simple, detection greatly suffers from noise floor increase and degradation in its performance. Another method is to lock free-running oscillators to the transmitted carrier frequency, using self-oscillating mixers (SOMs) to further reduce the size of communication systems. The signal is injected into the SOM and drives the oscillation to the same carrier frequency and phase. Hence, the triggered high power LO signal is used for down-conversion, and synchronization between the LO and RF signals is guaranteed, relaxing the restraints on phase correction. Another approach is to indirectly self-mix the transmitted signal. In this case, the received signal is mixed with a self-generated LO signal; i.e., the latter is generated by the signal itself after injection-locking the oscillator to the RF frequency. Such a receiver can be visualized as a homodyne receiver with self-generated LO reference.

The self-heterodyne mixing requires that the received power be equally partitioned between the RF and LO signals to achieve the best self-mixing performance. Therefore, half of the transmitted power contains no information, so in order to circumvent this problem, the power allocation for the LO and transmitted signal needs to be further optimized, increasing the complexity of such systems. In contrast, the CMB topology avoids the issue by adopting the indirect process of mixing the delayed versions of the received RF signals, one with the other. CMB topology deploys a self-mixing technique that takes advantage of both the time delays between the array elements and the ensuing beamforming behavior. The CMB topology introduces compatibility with all modulation techniques, where the self-generated LO signal autonomously engages in the phase delay cancellation and signal reception enhancement.

In phased arrays, received signals at a specific AoA experience different time delays at each of the spatially separated antenna elements of the array. To achieve maximum beamforming gain (i.e., diversity gain), these delays are compensated so that all received signals are combined coherently. While traditional methods employ phase shifters, which are bulky and impractical for multi-beam operation, embodiments of the subject invention avoid the use of these phase shifters by introducing the self-mixing concept. The architecture provides more flexibility in processing the signals coming from any AoA, with significant reduction in complexity, size, and cost as compared to current beamforming topologies, Consider a uniform linear array of N antenna elements, where N represents the number of elements in the array. The phase delays at the antenna elements uniformly increase by the same phase delay. For the sake of simplicity, assume the phase reference is the middle array element. The linear array of N elements is considered for demonstrative purposes only and is in no way limiting. Any suitable configuration and number of antenna elements can be used with embodiments of the subject invention. Also, the assumption of the middle array element being the phase reference is done for demonstrative purposes as well.

Consider a tone signal (i.e., a signal with no amplitude or phase information) received at the two oppositely spaced antenna elements relatively to the phase center. The phase delays at these oppositely spaced elements are $+\phi_0$ and $-\phi_0$, respectively. Therefore, by mixing the signals coming from the two oppositely spaced elements, the phase at the mixer's output is compensated, and the resulting signal becomes in phase with the reference. Similarly, this process can be extended to mixing every two spatially opposite elements with reference to the same center.

CMB can also be applied with modulated signals. However, there is a need to extract a pure tone from the modulated signal prior to feeding it to the mixer's LO input. In order to do so, indirect frequency synthesizing can be integrated into the CMB design/architecture (see FIGS. 4 and 16). The frequency synthesizer can accept a modulated signal as an input and extract a single frequency tone with appropriate power level, which can then be fed to the mixer's LO input.

Figure 5:
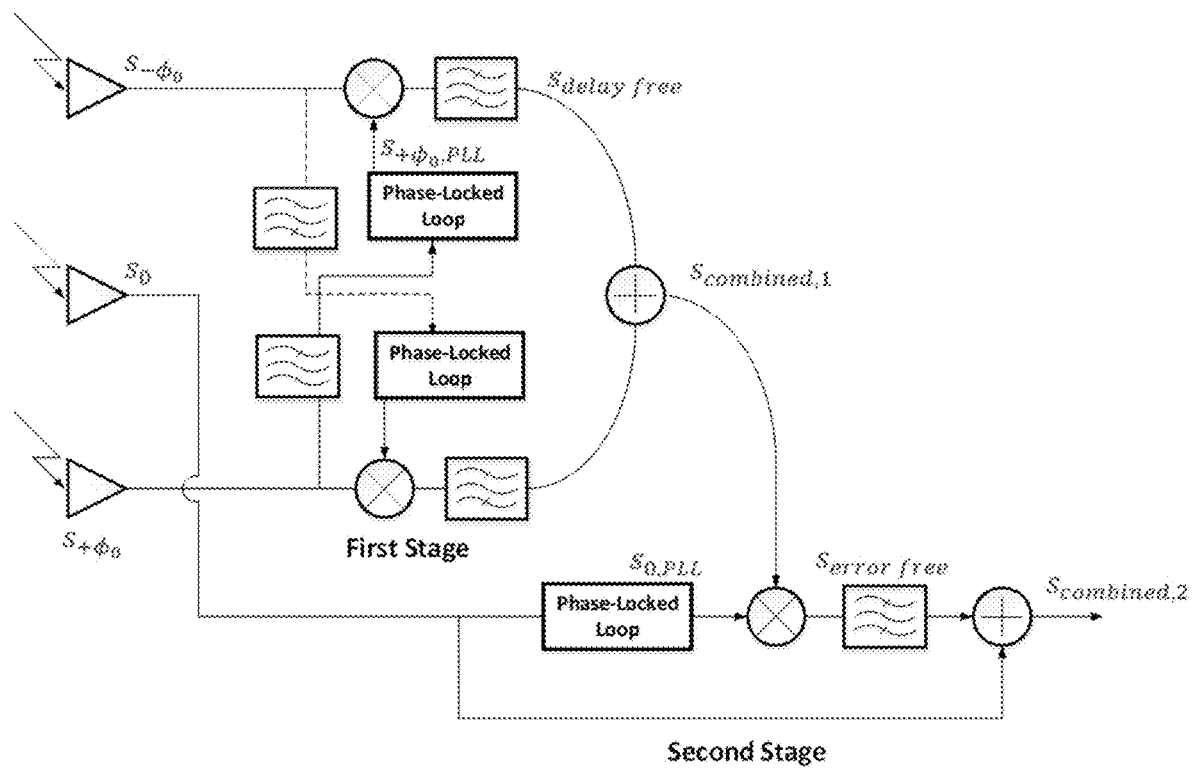
FIG. 5 is a schematic diagram of a cross-mixing beamformer (CMB) two-stage architecture for phase delay cancellation, according to an embodiment of the subject invention.

FIG. 5 is a schematic diagram of CMB two-stage architecture for phase delay cancellation, according to an embodiment of the subject invention. Referring to FIG. 5, the CMB can include two major stages of beamforming. In the first stage, each signal is mixed with an LO signal self-generated from its oppositely spaced element. This approach employs narrowband filtering and a phase-locked loop (PLL) to generate the LO signal from the received modulated signal. The PLL is fed with a portion of the received signal to synthesize the desired mixer's LO input signal. Ideally, the synthesized LO signal has a fixed peak amplitude with a phase congruent with the delay at each antenna element.

Next, the generated LO signal is mixed with the signal received at the opposite array element (see FIG. 5). As a result, the mixed signal is up-converted to twice the RF frequency with a phase equal to that of the phase center. This process is repeated for every two elements, oppositely spaced from the array center. As a result, coherent signal combining and diversity gain is achieved.

In order to explain the first stage of the CMB in more detail, a linearly spaced three-element array is considered for simplicity. The received signals at the two oppositely spaced elements, in reference to the middle element, are expressed as $$s_{\pm\phi_0}(t)=A(t)\cos(2\phi f_{RF}t+\phi_d(t)\pm\phi_0) \qquad (1)$$

where $A(t)$ and $\phi_d(t)$ are respectively the amplitude and phase modulation, $f_{RF}$ is the RF frequency, and $+\phi_0$ and $-\phi_0$ are the respective phase delays of the received signal at each element. $s_{+\phi_0}(t)$ is fed into the PLL to generate the LO signal of the mixer in the opposite chain. At the output of the PLL, the following is obtained:

$$s_{+\phi_0,PLL}(t)=A_L \cos(2\phi f_{RF}t+\phi'(t)+\phi_0) \quad (2)$$

where $A_L$ is the constant peak amplitude. The goal is to combine all the antenna elements in phase to achieve maximum diversity gain; for instance, for N antenna elements, the maximum diversity gain is $10 \log_{10} N$ (in decibels (dB)). For simplicity, assume $A_L=1$. $\phi'(t)$ accounts for the relatively slow variation in the generated LO tone. Embodiments take advantage of slow PLL designs and integrate them in the architecture. Such synthesizers will follow the filtered modulated signal very slowly. As such, the generated signal locks to the phase delay and tracks slowly the inputted variation. That is, the generated signal appears almost as a tone for the relatively faster-rate modulated signal. That said, the phase of the generated LO signal appears almost as a constant for a given timeframe. Ideally, $\phi'(t)$ is zero, but in any event the second stage of the CMB topology compensates this phase error.

The received signal at the oppositely spaced element $s_{-\phi_0}(t)$ is mixed with the self-generated LO signal $s_{+\phi_0,PLL}(t)$. That is, the product signal resulting from this stage is filtered out:

$$\begin{aligned} s_{delay\ free}(t) &= BPF[s_{-\phi_0}(t) \times s_{+\phi_0,PLL}(t)] \\ &= A(t)\cos(2\pi f_{RF}t + \phi_d(t) - \phi_0) \times \\ &\quad \cos(2\pi f_{RF}t + \phi'(t) + \phi_0)] \\ &= A(t)\cos(2\pi(2f_{RF})t + \phi_d(t) + \phi'(t)) \end{aligned} \quad (3)$$

To simplify the analysis, all conversion losses have been omitted in this explanation of the first stage.

Adopting the same process with the other array elements, the same output is realized after the mixing stage. As such, all output signals can be coherently combined, and after combining stage, the combined signal is $$s_{combined,1}(t)=2 \cdot A(t)\cos(2\pi(2f_{RF})t+\phi_d(t)+(t)) \quad (4)$$

The CMB architecture accomplishes phase delay cancellation and coherent signal combining, thereby improving the receiver's sensitivity and signal-to-noise ratio (SNR).

The second CMB stage is introduced into the design to compensate for the generated LO slow phase variation $\phi'/(t)$ in Equation (2). A part (e.g., a first part) of the middle antenna element signal can be fed to a PLL to generate an LO signal that follows $\phi'(t)$. The other part (e.g., a second part (the first and second parts can equal the entire signal)) of the middle antenna element signal can later be fed to the final combined signal. The received signal at the middle element (see FIG. 5) is expressed as $$s_0(t)=A(t)\cos(2\pi f_{RF}t+\phi_d(t)) \quad (5)$$

After feeding it to a PLL, the output signal is $$s_{0,PLL}(t)=A_L \cos(2\pi f_{RF}t+\phi'(t)) \quad (6)$$

Hence, $s_{0,PLL}(t)$ contains the same slow phase variation $\phi'(t)$ as the combined signal in Equation (4). By mixing $s_{combined,1}(t)$ with $s_{0,PLL}(t)$ and bandpass filtering, the following is obtained $$s_{error\ free} = BPF[s_{combined,1}(t) \times s_{0,PLL}(t)] \quad (7)$$

-continued
$$\begin{aligned} &= BPF[2 \cdot A(t)\cos(2\pi)2f_{RF})t + \phi_d(t) + \phi'(t)) \times \\ &\quad \cos(2\pi f_{RF}t + \phi'(t))] \\ &= 2 \cdot A(t)\cos(2\pi f_{RF}t + \phi_d(t)) \end{aligned}$$

In Equation (7), the output signal from stages 1 and 2 is the result of the self-mixing and combining two antenna elements together. Theoretically, the output SNR of the array is improved by a factor of the number of antenna elements when compared to that of a single-path receiver. As such, for maximum combining gain, a factor of three should be achieved when having three antenna elements. However, for the explanation case, $s_{error\ free}(t)$ has a factor of two. To compensate for this difference, the center element can be summed with $s_{error\ free}(t)$ to give a final combined signal $s_{combined,2}(t)$ of $$s_{combined,2}(t)=3 \cdot A(t)\cos(2\pi f_{RF}t+\phi_d(t)) \quad (8)$$

Related art self-mixing arrays are designed to mix the elements with themselves (Kornprobst et al., "A Millimeter-Wave Self-Mixing Array With Large Gain and Wide Angular Receiving Range," in IEEE Transactions on Antennas and Propagation, vol. 66, no. 2, pp. 702-711, February 2018; and Wang et al. "Selfmixing antenna arrays with wide receiving angular range," 2015 IEEE International Symposium on Antennas and Propagation & USNC/URSI National Radio Science Meeting, Vancouver, B C, 2015, pp. 647-648). As a result, the mixing of the received RF and LO signals coherently combines all the signals. With such architectures, the mixing approach becomes unable to track the direction from which the signal is radiated. That is, related art architectures are only classified as analog beamforming techniques, and they therefore cannot be assembled in subarray formations and integrated in hybrid structures.

Embodiments of the subject invention provide self-mixing array designs/architectures capable of retaining the AoA of signals and fulfilling all beamforming requisites. Instead of mixing the elements with themselves, the beamforming method is based on mixing every two elements with one another (e.g., each two oppositely-spaced elements). With the CMB, not only are all delays in reception eliminated, but also the AoA information of the received signal is preserved. Thus, the CMB can be implemented for both tracking and sensitivity enhancement applications, and as a result the CMB can be associated with hybrid beamforming techniques. In addition, the CMB provides avenues for a new class of self-mixing subarrays, and this concept is the first to operate in hybrid beamforming architectures across a wide bandwidth, independent of frequency and direction of arrival (i.e., AoA).

Figure 17:
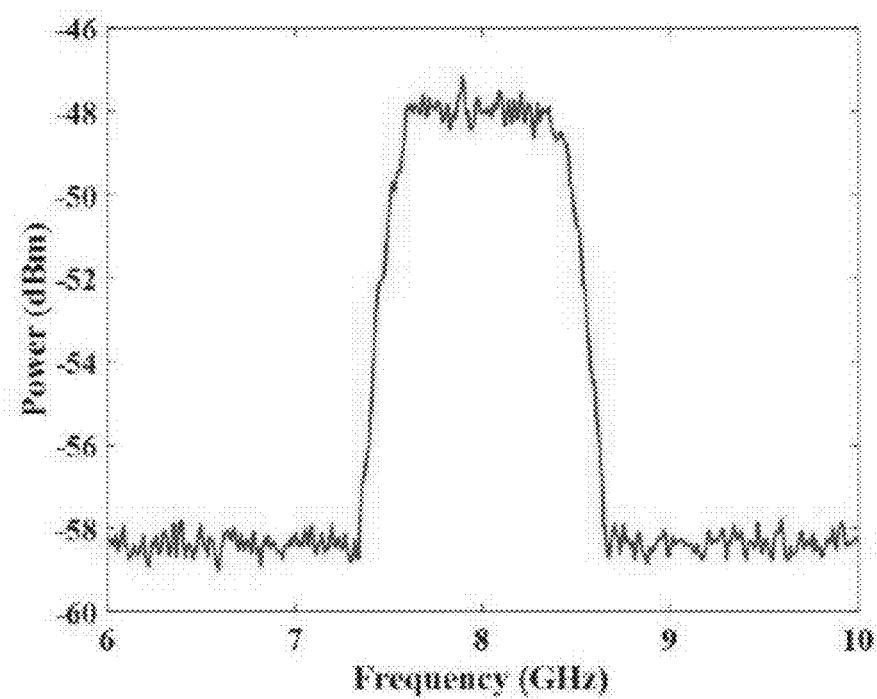
FIG. 17 is a plot of power (in decibels relative to 1 milliwatt (dBm)) versus frequency (in gigahertz (GHz)) for a modulated signal.
Figure 18:
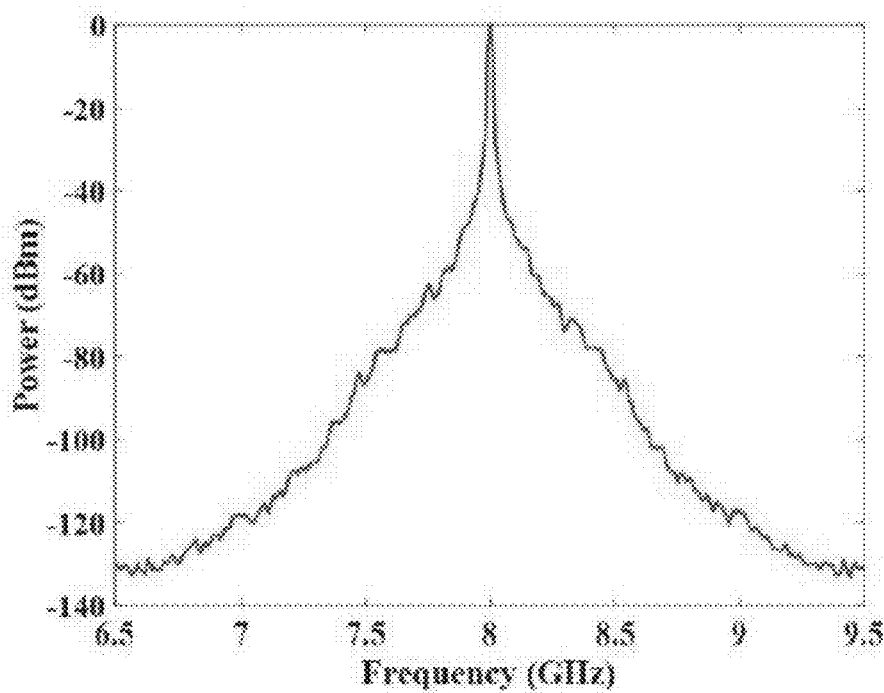
FIG. 18 is a plot of power (in dBm) versus frequency (in GHz) for a synthesized LO signal based on the signal of FIG. 17.
Figure 19:
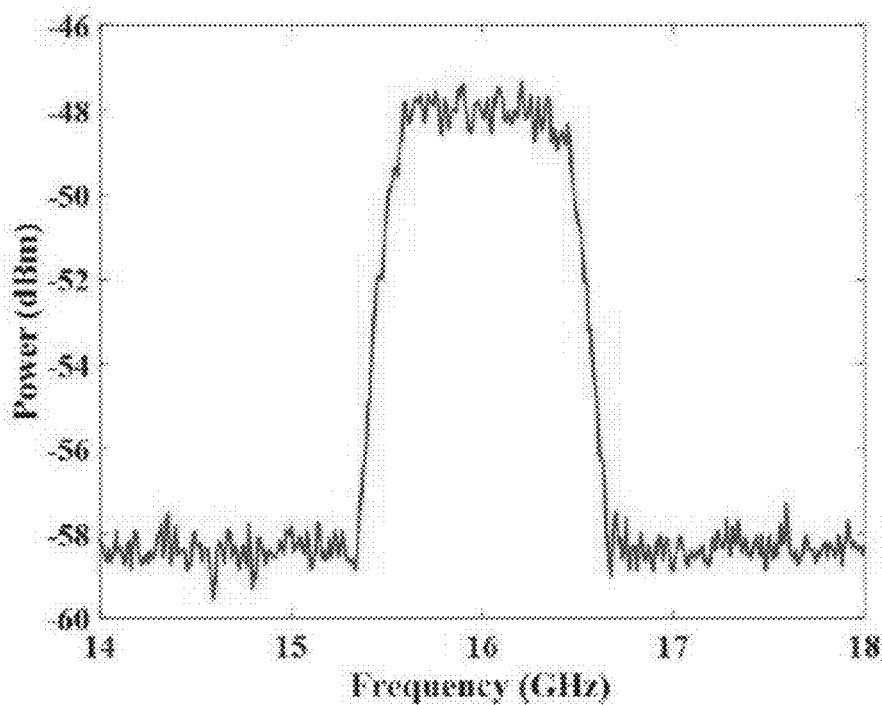
FIG. 19 is a plot of power (in dBm) versus frequency (in GHz) for an output signal from a self-mixing process, according to an embodiment of the subject invention, using the signal of FIG. 17 as an input.
Figure 20:
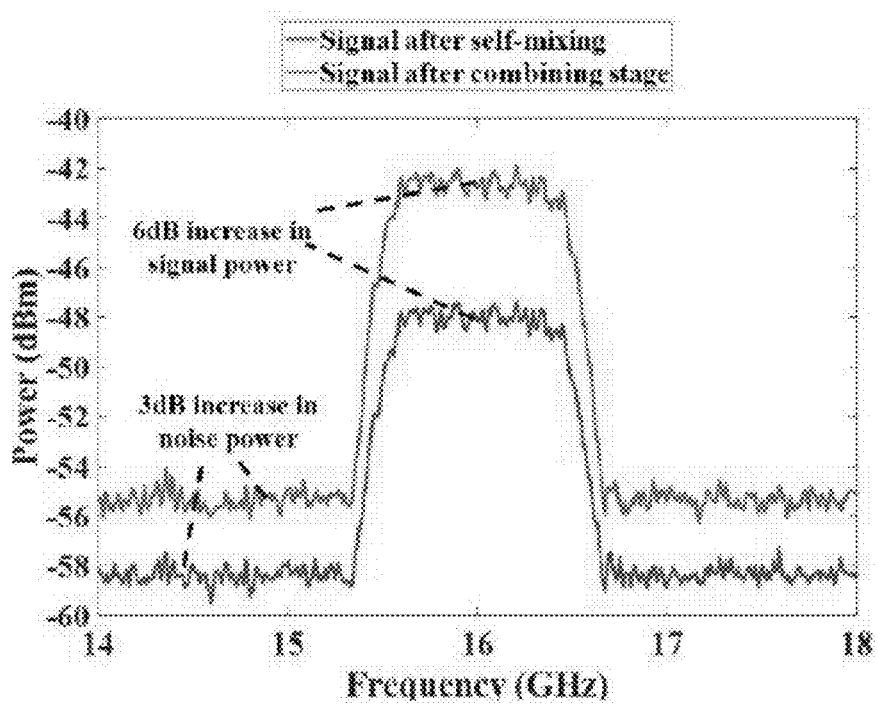
FIG. 20 is a plot of power (in dBm) versus frequency (in GHz) for an output signal from a self-mixing process and an output signal after a combining stage, according to an embodiment of the subject invention. The curve that is higher at 16 GHz is for the signal after the combining stage; and the curve that is lower at 16 GHz is for the signal after self-mixing.

FIG. 17 is a plot of power (in decibels relative to 1 milliwatt (dBm)) versus frequency (in gigahertz (GHz)) for a modulated signal; FIG. 18 is a plot of power (in dBm) versus frequency (in GHz) for a synthesized LO signal based on the signal of FIG. 17; and FIG. 19 is a plot of power (in dBm) versus frequency (in GHz) for an output signal from a self-mixing process, according to an embodiment of the subject invention, using the signal of FIG. 17 as an input. FIG. 20 is a plot of power (in dBm) versus frequency (in GHz) for an output signal from a self-mixing process and an output signal after a combining stage, according to an embodiment of the subject invention. Referring to FIG. 20, a 3 dB gain is achieved using two antenna elements. The CMB architecture of embodiments of the subject invention accomplishes phase delay cancellation, coherent signal combining, and improvement in the sensitivity of the receiver.

Embodiments of the subject invention provide CMB systems and methods, including a self-mixing array based on indirectly mixing every two oppositely spaced elements in reference to a center element to achieve coherent signal combining. CMB introduces a topology that exploits the information signal to extract the LO signal used to drive the mixers. This concept of phase delay cancellation is highly flexible and achieves significant reduction in SWaP compared to related art beamformers. The CMB's delay cancellation shows no constraints on frequency of operation or AoA. That is, the CMB is compatible with wideband apertures, promising more compact front-ends with enhanced degree of flexibility. The CMB can be manufactured with printed circuit board (PCB) technology for low-cost mass production. The small form factor and compatibility with current and envisioned future technology makes the CMB systems and methods useful for commercial, military, and scientific sectors.

Embodiments of the subject invention provide hardware-reduced RF front-end supporting a hybrid beamformer (see also FIG. 1). Central to the CMB is the element-to-element mixing concept to minimize or avoid the use of conventional bulky analog phase shifters. The system is able to achieve near theoretical SNR gain in the presence of AWGN channel. Referring to FIG. 1, hybrid beamformer can include an analog stage based on element-to-element mixing and a digital stage. At the analog stage, a massive array with a large number of elements is divided into smaller sub-arrays. Each sub-array is connected to a CMB network and a single RF chain.

Figure 13:
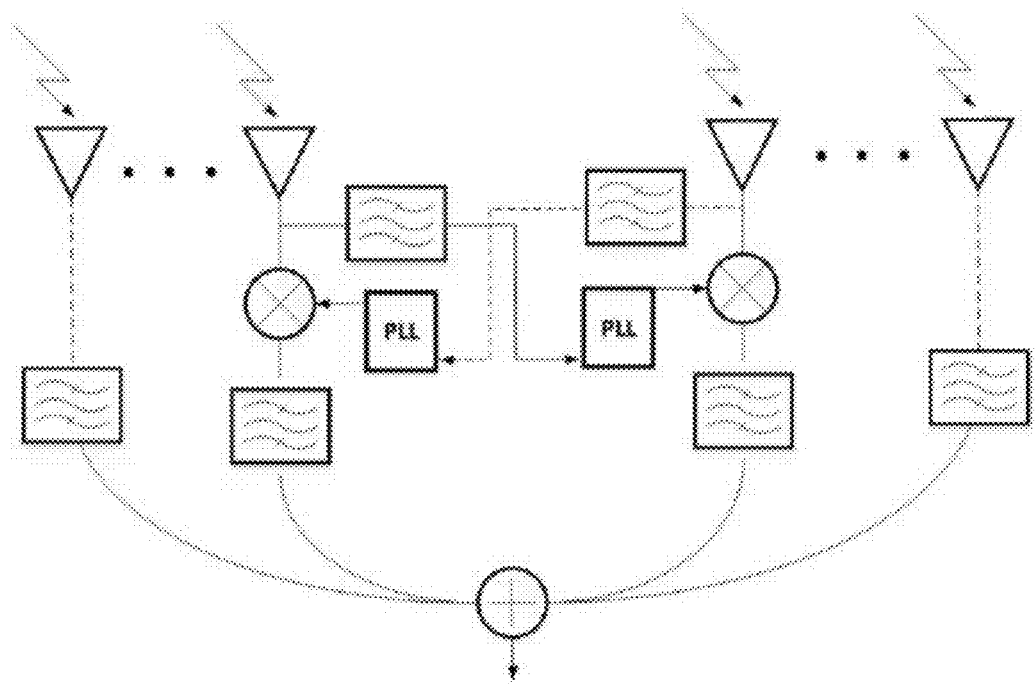
FIG. 13 is a schematic diagram depicting the beamforming concept based on an element-to-element mixing (BEEM) architecture, according to an embodiment of the subject invention.
Figure 14:
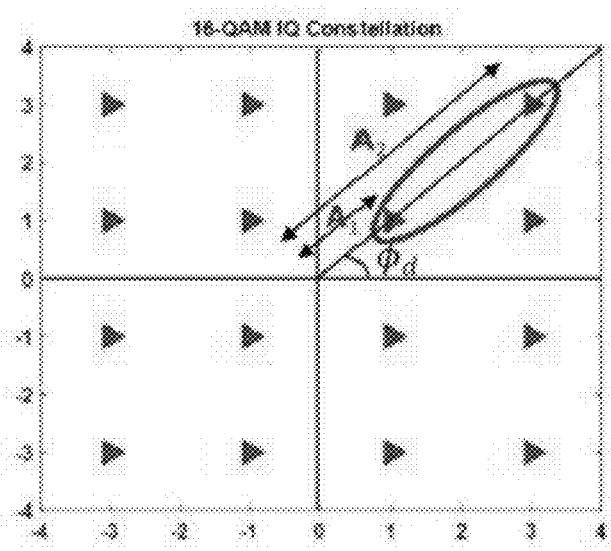
FIG. 14 is an IQ constellation diagram for a 16-QAM signal.
Figure 15:
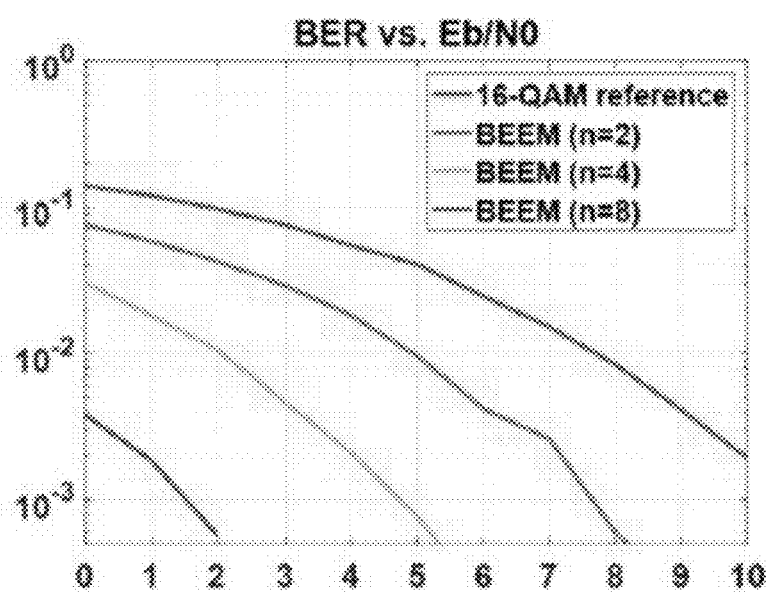
FIG. 15 is a plot of the BER curves for a 16-QAM signal with an AWGN channel, using arrays of 2, 4, and 8 elements (i.e., using n=2, 4, and 8). Starting from the lower-left of the plot and moving to the upper-right, the first curve is for BEEM (n=8), the second curve is for BEEM (n=4), the third curve is for BEEM (n=2), and the fourth curve is for the 16-QAM reference.

FIG. 13 is a schematic diagram depicting the CMB beamforming architecture, according to an embodiment of the subject invention. For demonstrative purposes only, a uniform linear array is considered, but this concept can be extended to multi-dimensional arrays. Referring to FIG. 13, the design can exploit the process of mixing two opposite elements (in reference to a center element) with one another, but without using physical LO sources on the receiver's chain. Instead, each antenna element can be fed to a PLL circuit, which locks the phase of the signal to the phase delay of the input and feeds it to the mixer of the oppositely spaced antenna element. In doing so, the phase lag at one element cancels out the phase lead at the corresponding opposite element, so the process yields delay-free signals and a compensation of the phase delays. This concept in FIG. 13 is a departure from using related art RF mixers where an external source is required to generate the LO signal. Instead, the CMB system can generate its LO from the received signal. In addition, the element-to-element mixing process allows for coherent signal combining without using phase shifters as in related art analog beamformers, while also providing unprecedented flexibility in the analog domain. Further, the design is agnostic to all incoming signals regardless of their AoA. By contrast, related art beamformers are fixed to a certain angle and require a hardware modification for each AoA. Moreover, CMB does not lose the AoA information as with many related art architectures. As such, the CMB design can be assembled as a subarray and integrated in hybrid beamforming structures. The CMB design can also capture desired signals and reject all interferers.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to the invention.

Example 1—Signal with Fixed Equi-Phase Symbols

A simulation was performed to show the concept of the CMB of an embodiment of the subject invention (FIGS. 4 and 5) and of phase delay cancellation after self-mixing. A linear three-element array receiving a 16-QAM signal was considered for this simulation, The simulation took into account only two of the possible modulation symbols, characterized by having the same phase modulation $\varphi_d$, hence varying in only their amplitudes $A_1$, $A_2$ (see FIG. 6, which is an in-phase and quadrature (IQ) constellation diagram). In other words, by limiting the set of possible transmitted symbols, it can be better determined what to observe at the final combining stage.

Figure 6:
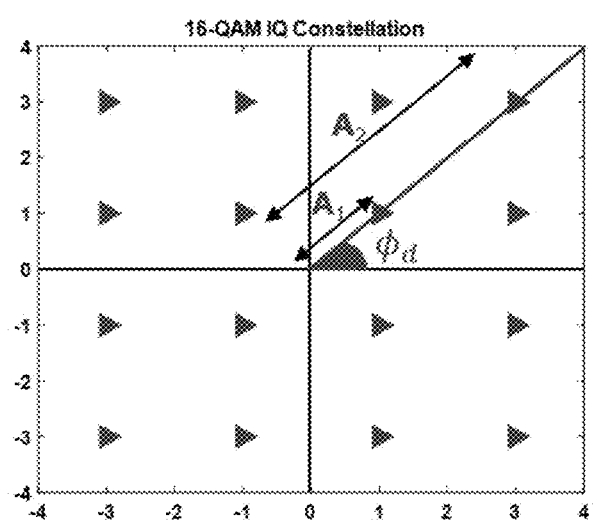
FIG. 6 is an IQ (in-phase and quadrature) constellation diagram for a 16-quadrature amplitude modulation (16-QAM) signal.
Figure 7:
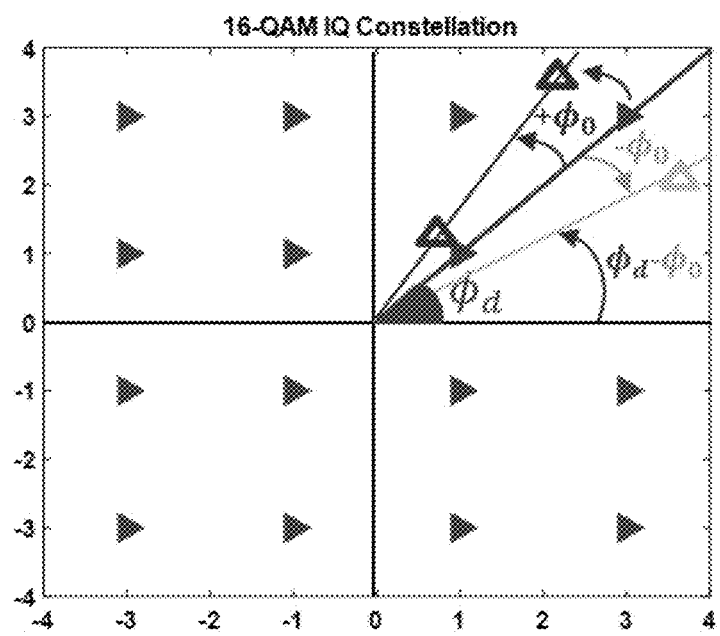
FIG. 7 is an IQ constellation diagram for the modulation symbols after phase shifting of the signal from FIG. 6.
Figure 8:
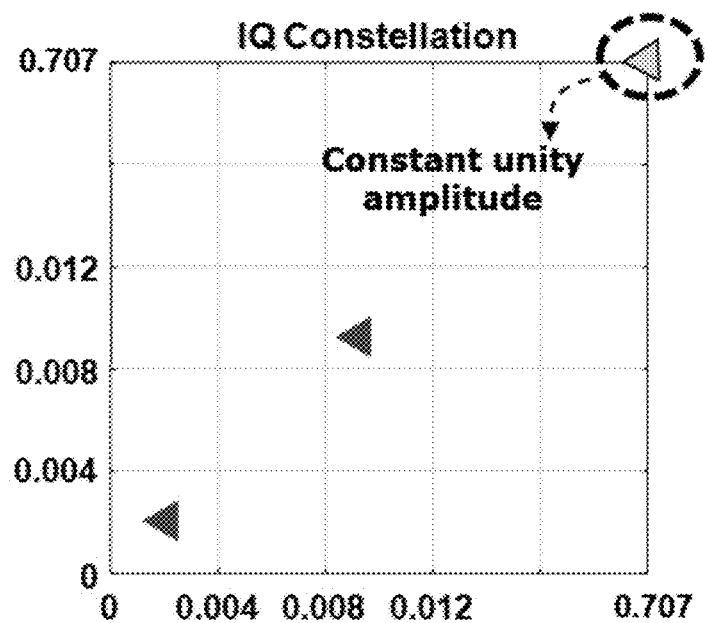
FIG. 8 is an IQ constellation diagram for a phase-locked loop (PLL) output signal. The PLL output signal is a fixed constant amplitude tone in phase with the symbol.

FIG. 7 is an IQ constellation diagram for the modulation symbols after phase shifting of the signal from FIG. 6; that is, FIG. 7 displays the phase-shifted symbols at their expected locations due to the phase delays. FIG. 8 is an IQ constellation diagram for a PLL output signal, which is a fixed constant amplitude tone in phase with the symbol.

The first simulation shows that, by feeding a filtered version of the original signal to the PLL, its output signal provides a fixed constant amplitude, unconstrained by the feeding signal's amplitude variation, and locks to the phase as expected, which for this particular case is the modulation phase $\varphi_d$ (see FIG. 8).

By restricting the signal to only one phase modulation, the previously declared variable $\varphi'$ in Equation (2) equates to zero only for this case. In other words, the generated LO signal locks to the fixed phase $\varphi_d \pm \varphi_0$.

Figure 9:
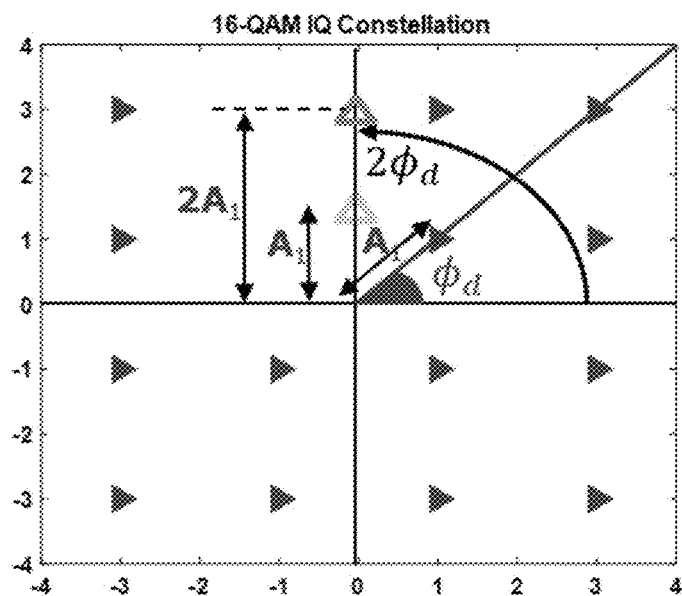
FIG. 9 is an IQ constellation diagram for a 16-QAM signal showing symbols at the combining stage.
Figure 10:
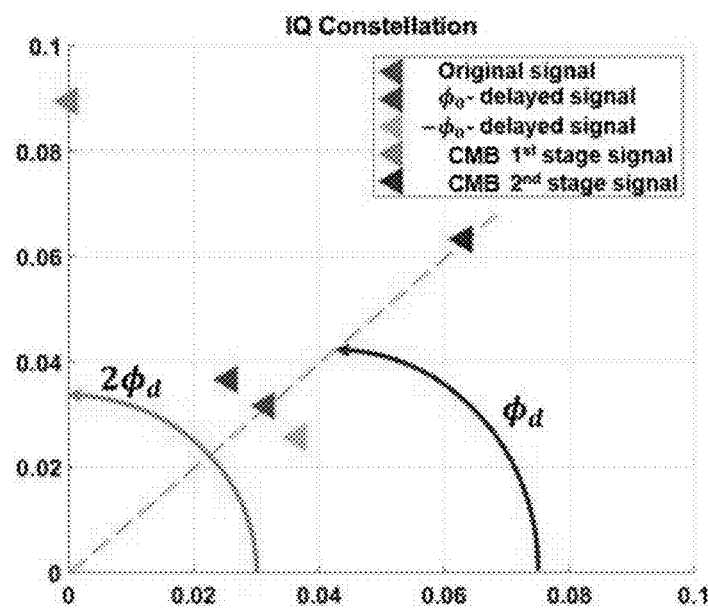
FIG. 10 is an IQ constellation diagram for the results of a simulation, showing symbols at the combining stage. The triangle in the upper-left is for CMB first stage signal; the triangle in the upper-right is for the CMB second stage signal; the left-most triangle from the grouping of three in the lower-left of the constellation is for the $\phi_0$-delayed signal; the middle triangle from the grouping of three in the lower-left of the constellation is for the original signal; and the right-most triangle from the grouping of three in the lower-left of the constellation is for the $\phi_0$-delayed signal.

Next, the phase delay cancellation after the first stage of mixing process was examined. The phase variation was followed thoroughly at each step to show the doubling that occurs as a result of the CMB. FIG. 9 is an IQ constellation diagram for a 16-quadrature amplitude modulation (16-QAM) signal showing symbols at the combining stage. Referring to FIG. 9, if the symbol with amplitude $A_1$ and phase $\varphi_d$ is transmitted, the combined signal will be sitting at twice the amplitude and phase modulation ($2A_1$; $2\varphi_d$), assuming an ideal case where the conversion loss is not present. That is, by adopting an ideal system and a noiseless channel for this simulation (i.e., accounting only for the delays in signal reception), the resulting signal at the CMB's first combining stage and second stage conversion can be plotted, and the aforementioned proposition can be validated (see FIG. 10).

Figure 11:
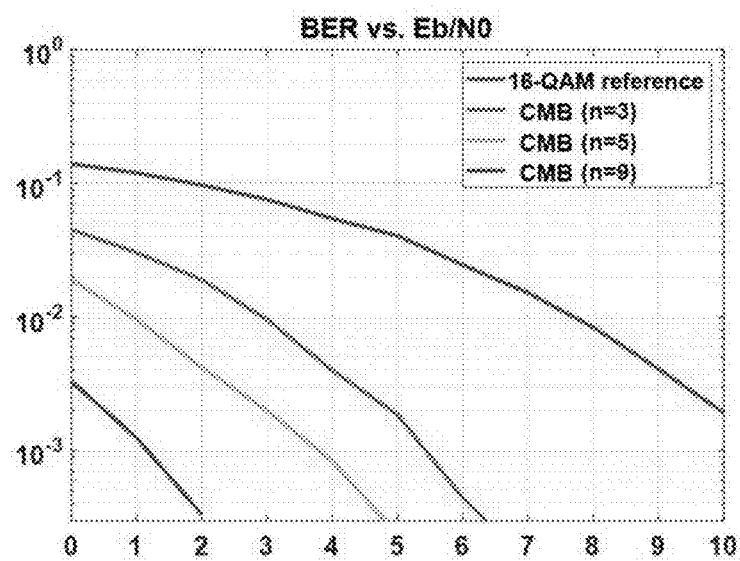
FIG. 11 is a plot of the bit error rate (BER) curves for a 16-QAM signal with an additive white Gaussian noise (AWGN) channel, using arrays of 3, 5, and 9 elements (i.e., using n=3, 5, and 9). Starting from the lower-left of the plot and moving to the upper-right, the first curve is for CMB (n=9), the second curve is for CMB (n=5), the third curve is for CMB (n=3), and the fourth curve is for the 16-QAM reference.

The bit error rate (BER) curves (see FIG. 11) show the accomplished diversity gain and sensitivity enhancement as compared to a single-path receiver. Assuming a real system and an additive white Gaussian noise (AWGN) channel, a near theoretical 4.77, 7, and 9.5 dB gain is achieved with the CMB when having 3, 5, and 9 array elements, respectively (see FIG. 11).

Example 2—Random 16-QAM Input Signal

Figure 12:
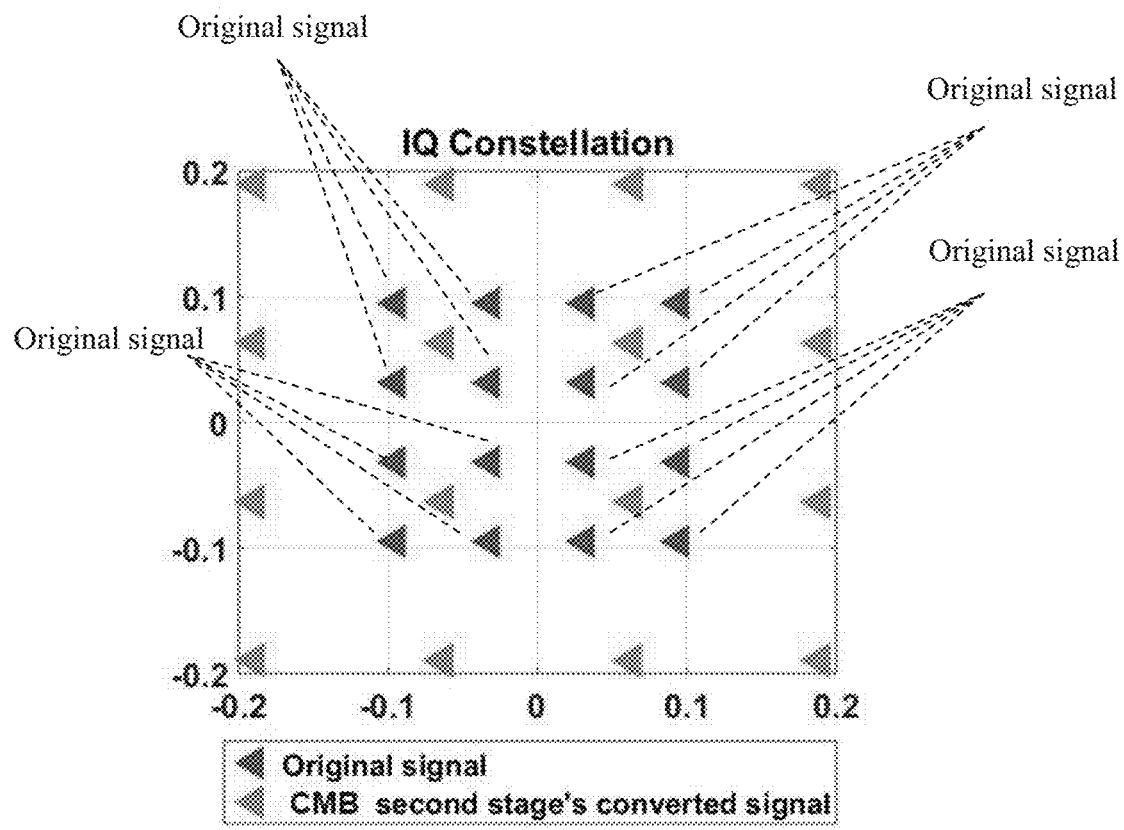
FIG. 12 is an IQ constellation diagram showing the CMB second stage's converted signal compared to the original signal. Any triangle not labeled as "original signal" is for the CMB second stage's converted signal.

A random 16-QAM signal, of <1% and an RF frequency of 8 GHz, was assumed. In this simulation, a noiseless channel was assumed for simplicity. FIG. 12 is an IQ constellation diagram showing the CMB second stage's converted signal compared to the original signal. Referring to FIG. 12, it is confirmed that the overall two-stage conversion process compensates for the delays in signal reception. That is, MB accomplishes the phase delay cancellation required for beamforming. Therefore, after the second stage of down-conversion, the resulting signal contains the same phase as that of the delay-free original signal.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A cross-mixing beamformer (CMB) device, comprising:
   a first plurality of antenna elements; and
   a first CMB in operable communication with the first plurality of antenna elements,
   the first CMB being configured to respectively mix signals from oppositely spaced antenna elements of the first plurality of antenna elements to generate a first plurality of mixed signals that are summed to generate a first combined signal, such that a first local oscillator (LO) signal from a first antenna element is mixed with a first radio frequency (RF) signal from a second antenna element oppositely spaced, about a phase center of the first plurality of antenna elements, from the first antenna element to generate a first mixed signal of the first plurality of mixed signals and such that a second LO signal from the second antenna element is mixed with a second RF signal from the first antenna element to generate a second mixed signal of the first plurality of mixed signals.

2. The CMB device according to claim 1, the first CMB being configured to put incident signals received by the respective antenna elements of the first plurality of antenna elements through respective phase-locked loops (PLLs) prior to mixing, such that a first incident signal received by the first antenna element is put through a first PLL to generate the first LO signal, and a second incident signal received by the second antenna element is put through a second PLL to generate the second LO signal.

3. The CMB device according to claim 1, the first plurality of antenna elements comprising a first middle antenna element at the phase center of the first plurality of antenna elements, and
   the first CMB being configured to split a first middle incident signal into a first part and a second part, put the first part of the first middle incident signal through a first middle PLL to generate a first middle PLL signal, mix the first middle PLL signal with the first combined signal to generate a first corrected signal, and combine the second part of the first middle incident signal with the first corrected signal to generate a first output signal of the first CMB.

4. The CMB device according to claim 1, the first plurality of antenna elements comprising the first antenna element, the second antenna element, a third antenna element, and a fourth antenna element oppositely spaced about the phase center from the third antenna element, and
   the first CMB being configured to mix a third LO signal from the third antenna element with a third RF signal from the fourth antenna element to generate a third mixed signal of the first plurality of mixed signals and to mix a fourth LO signal from the fourth antenna element with a fourth RF signal from the third antenna element to generate a fourth mixed signal of the first plurality of mixed signals.

5. The first CMB device according to claim 4, the first CMB being configured to put incident signals received by the respective antenna elements of the first plurality of antenna elements through respective phase-locked loops (PLLs) prior to mixing, such that a first incident signal received by the first antenna element is put through a first PLL to generate the first LO signal, a second incident signal received by the second antenna element is put through a second PLL to generate the second LO signal, a third incident signal received by the third antenna element is put through a third PLL to generate the third LO signal, and a fourth incident signal received by the fourth antenna element is put through a fourth PLL to generate the fourth LO signal.

6. The CMB device according to claim 1, the first plurality of antenna elements comprising a first subarray of antenna elements.

7. The CMB device according to claim 1, further comprising a first analog-to-digital converter (ADC) in operable communication with the first CMB and configured to receive a first output signal from the first CMB.

8. The CMB device according to claim 1, further comprising:
   a second plurality of antenna elements; and
   a second CMB in operable communication with the second plurality of antenna elements,
   the second CMB being configured to respectively mix signals from oppositely spaced antenna elements of the plurality of antenna elements to generate a second plurality of mixed signals that are summed to generate a second combined signal, such that a fifth local oscillator (LO) signal from a fifth antenna element of the second plurality of antenna elements is mixed with a fifth RF signal from a sixth antenna element oppositely spaced, about a phase center of the second plurality of antenna elements, from the fifth antenna element to produce a fifth mixed signal of the second plurality of mixed signals and such that a sixth LO signal from the sixth antenna element is mixed with a sixth RF signal from the fifth antenna element to produce a sixth mixed signal of the second plurality of mixed signals.

9. The CMB device according to claim 8, the second plurality of antenna elements comprising a second subarray of antenna elements.

10. The CMB device according to claim 9, further comprising a second ADC in operable communication with the second CMB and configured to receive a second output signal from the second CMB.

11. A method of cross-mixing beamforming, the method comprising:
    receiving, by a first plurality of antenna elements, a first plurality of incident signals, respectively; and
    respectively mixing, by a first cross-mixing beamformer (CMB) in operable communication with the first plurality of antenna elements, signals from oppositely spaced antenna elements of the first plurality of antenna elements to generate a first plurality of mixed signals that are summed to generate a first combined signal, such that a first local oscillator (LO) signal from a first antenna element is mixed with a first radio frequency (RF) signal from a second antenna element oppositely spaced, about a phase center of the first plurality of antenna elements, from the first antenna element to generate a first mixed signal of the first plurality of mixed signals and such that a second LO signal from the second antenna element is mixed with a second RF signal from the first antenna element to generate a second mixed signal of the first plurality of mixed signals.

12. The method according to claim 11, further comprising:
putting, by the first CMB, the incident signals received by the respective antenna elements of the first plurality of antenna elements through respective phase-locked loops (PLLs) prior to mixing, such that a first incident signal received by the first antenna element is put through a first PLL to generate the first LO signal, and a second incident signal received by the second antenna element is put through a second PLL to generate the second LO signal.

13. The method according to claim 11, the first plurality of antenna elements comprising a first middle antenna element at the phase center of the first plurality of antenna elements, the first middle antenna receiving a first middle incident signal of the first plurality of incident signals, and the method further comprising:
splitting, by the first CMB, the first middle incident signal into a first part and a second part;
putting, by the first CMB, the first part of the first middle incident signal through a first middle PLL to generate a first middle PLL signal;
mixing, by the first CMB, the first middle PLL signal with the first combined signal to generate a first corrected signal; and
combining, by the first CMB, the second part of the first middle incident signal with the first corrected signal to generate a first output signal of the first CMB.

14. The method according to claim 11, the first plurality of antenna elements comprising the first antenna element, the second antenna element, a third antenna element, and a fourth antenna element oppositely spaced about the phase center from the third antenna element, and
the method further comprising mixing, by the first CMB, a third LO signal from the third antenna element with a third RF signal from the fourth antenna element to generate a third mixed signal of the first plurality of mixed signals and mixing a fourth LO signal from the fourth antenna element with a fourth RF signal from the third antenna element to generate a fourth mixed signal of the first plurality of mixed signals.

15. The first method according to claim 14, the method further comprising:
putting, by the first CMB, the incident signals received by the respective antenna elements of the first plurality of antenna elements through respective phase-locked loops (PLLs) prior to mixing, such that a first incident signal received by the first antenna element is put through a first PLL to generate the first LO signal, a second incident signal received by the second antenna element is put through a second PLL to generate the second LO signal, a third incident signal received by the third antenna element is put through a third PLL to generate the third LO signal, and a fourth incident signal received by the fourth antenna element is put through a fourth PLL to generate the fourth LO signal.

16. The method according to claim 11, the first plurality of antenna elements comprising a first subarray of antenna elements.

17. The method according to claim 11, further comprising sending, by the first CMB, a first output signal to a first analog-to-digital converter (ADC) in operable communication with the first CMB.

18. The method according to claim 11, further comprising:
receiving, by a second plurality of antenna elements, a second plurality of incident signals, respectively; and
respectively mixing, by a second cross-mixing beamformer (CMB) in operable communication with the second plurality of antenna elements, signals from oppositely spaced antenna elements of the second plurality of antenna elements to generate a second plurality of mixed signals that are summed to generate a second combined signal, such that a fifth local oscillator (LO) signal from a fifth antenna element is mixed with a fifth RF signal from a sixth antenna element oppositely spaced, about a phase center of the second plurality of antenna elements, from the fifth antenna element to generate a fifth mixed signal of the second plurality of mixed signals and such that a sixth LO signal from the sixth antenna element is mixed with a sixth RF signal from the fifth antenna element to generate a sixth mixed signal of the second plurality of mixed signals.

19. The method according to claim 18, the first plurality of antenna elements comprising a first subarray of antenna elements,
the second plurality of antenna elements comprising a second subarray of antenna elements,
the first plurality of antenna elements comprising a first middle antenna element at the phase center of the first plurality of antenna elements, the first middle antenna receiving a first middle incident signal of the first plurality of incident signals,
the second plurality of antenna elements comprising a second middle antenna element at the phase center of the second plurality of antenna elements, the second middle antenna receiving a second middle incident signal of the first plurality of incident signals, and
the method further comprising:
splitting, by the first CMB, the first middle incident signal into a first part and a second part;
putting, by the first CMB, the first part of the first middle incident signal through a first middle PLL to generate a first middle PLL signal;
mixing, by the first CMB, the first middle PLL signal with the first combined signal to generate a first corrected signal;
combining, by the first CMB, the second part of the first middle incident signal with the first corrected signal to generate a first output signal of the first CMB;
splitting, by the second CMB, the second middle incident signal into a first part and a second part;
putting, by the second CMB, the first part of the second middle incident signal through a second middle PLL to generate a second middle PLL signal;
mixing, by the second CMB, the second middle PLL signal with the second combined signal to generate a second corrected signal;
combining, by the second CMB, the second part of the second middle incident signal with the second corrected signal to generate a second output signal of the second CMB;
sending, by the first CMB, the first output signal to a first ADC in operable communication with the first CMB; and sending, by the second CMB, the second output signal to a second ADC in operable communication with the second CMB.

20. A cross-mixing beamformer (CMB) device, comprising:
- a plurality of subarrays, each subarray comprising a plurality of antenna elements; and
- a plurality of CMBs in operable communication with the plurality of subarrays, respectively; and
- a plurality of analog-to-digital converters (ADCs) in operable communication with the plurality of CMBs, respectively, and configured to respectively receive an output signal therefrom,
- each CMB of the plurality of CMBs being configured to respectively mix signals from oppositely spaced antenna elements of the plurality of antenna elements with which the CMB is in operable communication to generate a first plurality of mixed signals that are summed to generate a first combined signal, such that a first local oscillator (LO) signal from a first antenna element is mixed with a first radio frequency (RF) signal from a second antenna element oppositely spaced, about a phase center of the plurality of antenna elements, from the first antenna element to generate a first mixed signal of the first plurality of mixed signals and such that a second LO signal from the second antenna element is mixed with a second RF signal from the second antenna element to generate a second mixed signal of the first plurality of mixed signals,
- each CMB being configured to put incident signals received by the respective antenna elements of the plurality of antenna elements with which the CMB is in operable communication through respective phase-locked loops (PLLs) prior to mixing, such that a first incident signal received by the first antenna element is put through a first PLL to generate the first LO signal, and a second incident signal received by the second antenna element is put through a second PLL to generate the second LO signal,
- each plurality of antenna elements comprising a first middle antenna element at the phase center thereof, and
- each CMB being configured to split a first middle incident signal received by the respective first middle antenna element into a first part and a second part, put the first part of the first middle incident signal through a first middle PLL to generate a first middle PLL signal, mix the first middle PLL signal with the first combined signal to generate a first corrected signal, and combine the second part of the first middle incident signal with the first corrected signal to generate a first output signal of the first CMB.

* * * * *